United States Patent [19]

Baker

[11] 4,074,239

[45] * Feb. 14, 1978

[54] MEMORY CELL WITH NONDESTRUCTIVE RECALL

[76] Inventor: Roger T. Baker, Box 240, Mount Tabor, N.J. 07878

[*] Notice: The portion of the term of this patent subsequent to Dec. 14, 1993, has been disclaimed.

[21] Appl. No.: 670,143

[22] Filed: Mar. 25, 1976

Related U.S. Application Data

[63] Continuation-in-part of Ser. No. 642,721, Dec. 22, 1975, Pat. No. 4,015,247, which is a continuation-in-part of Ser. No. 613,189, Dec. 14, 1976, Pat. No. 3,997,799.

[51] Int. Cl.$^2$ .................. G11C 7/00; G11C 11/34
[52] U.S. Cl. .................. 365/176; 307/238; 357/24; 365/49
[58] Field of Search ..... 340/173 R, 173 AM, 173 FF, 340/173 CA; 307/238, 304; 357/24

[56] References Cited

U.S. PATENT DOCUMENTS

| | | | |
|---|---|---|---|
| 3,654,499 | 4/1972 | Smith | 340/173 R |
| 3,720,922 | 3/1973 | Kosonocky | 340/173 R |
| 3,914,748 | 10/1975 | Barton et al. | 340/173 R |
| 3,997,799 | 12/1976 | Baker | 340/173 CA |

OTHER PUBLICATIONS

Tiemann et al., A Surface-Charge Correlator, IEEE, Journal of Solid-State Circuits, vol. SC-9, No. 6, 12/74, pp. 403-410.
Heller et al., Random Access Potential Ramp Memory for Charge-Coupled Devices, IBM Technical Disclosure Bulletin, vol. 14, No. 2, 7/71, pp. 485-486.
Garner, State-of-Solid-State, Radio-Electronics, 8/73, pp. 56-58.
Chai et al., Charge-Coupled Device as a Nondestructive Serial-Write, Parallel-Read Device, IBM Technical Disclosure Bulletin, vol. 16, No. 12, 5/74, pp. 3870-3871.

*Primary Examiner*—Stuart N. Hecker

[57] ABSTRACT

In a semiconductor memory cell in which binary data is represented by the density of minority carriers stored in the inversion regions of two isolated MIS capacitors, a method of nondestructively recalling the datum stored therein is described. In this method, the minority carriers are extracted from either one or both of the inversion regions, and the resulting potential change across either one or both of the MIS capacitors is indicative of the datum stored in the memory cell. These memory cells can be used in random access memories with nondestructive recall and in content addressable memories.

14 Claims, 12 Drawing Figures

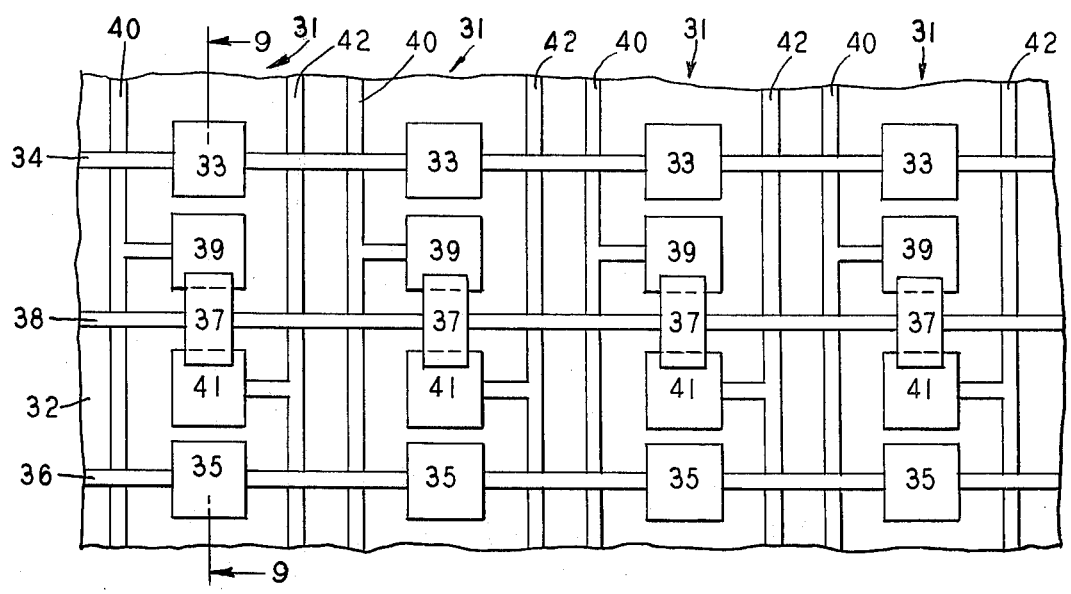
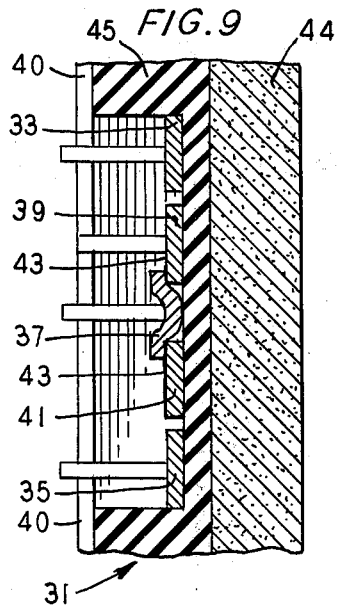
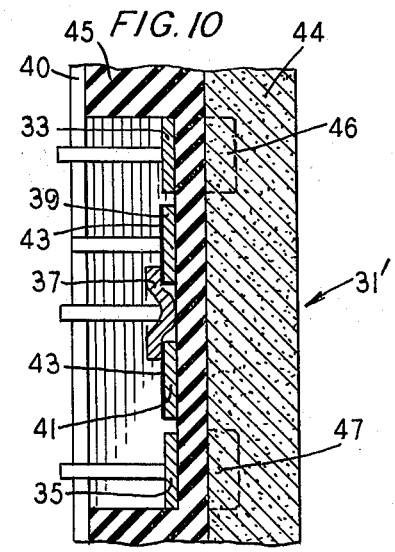
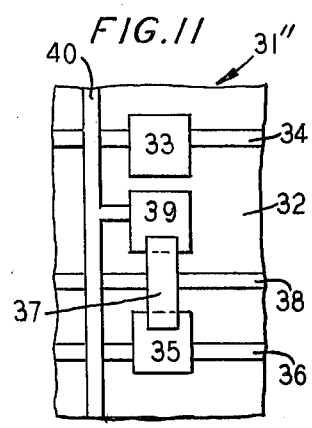
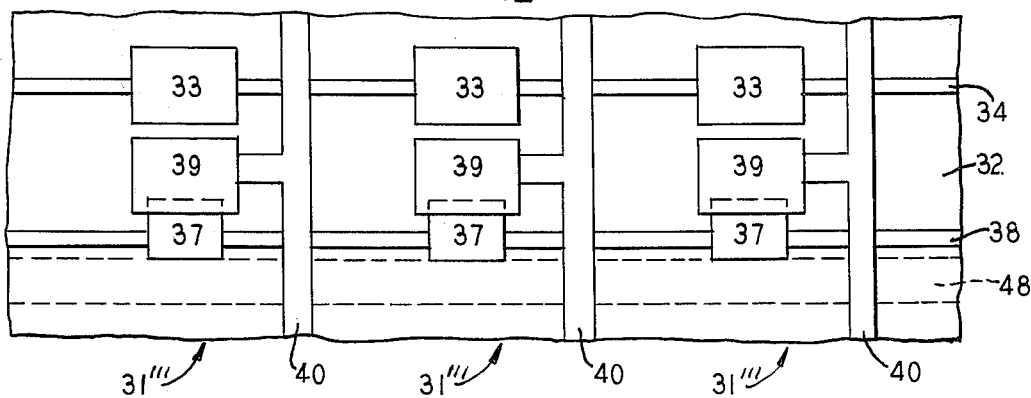

MEMORY CELL WITH NONDESTRUCTIVE RECALL

This application is a continuation in part of the copending application, Ser. No. 642,721, now U.S. Pat. No. 4,015,247, entitled "Method for Operating Charge Transfer Memory Cells", filed on Dec. 22, 1975 by Roger T. Baker, and is a continuation in part of Ser. No. 613,189 now U.S. Pat. No. 3,997,799, issued on Dec. 14, 1976 to Roger T. Baker for A Semiconductor-Device for the Storage of Binary Data.

BACKGROUND OF THE INVENTION

This invention relates generally to a method of operating semiconductor memory cells, and in particular to a method of operating dynamic semiconductor memory cells with capacitive means for the storage of binary data.

The economies relevent to semiconductor random access memories make it desirable to minimize the semiconductor surface area required per stored bit, and thus to use minimum size memory cells, such as the one transistor memory cell. However, memories utilizing such minimum size memory cells often do not include features such as content addressing capability and nondestructive recall capability.

In general most semiconductor memory cells with content addressing capability can also be operated as random access memory cells with nondestructive recall. Also the combination of two random access memory cells with nondestructive recall capability can often be used as a content addressable memory cell. Therefore, although content addressability and nondestructive recall are usually considered unrelated properties of a memory cell, they are in fact closely related.

In the prior art, several types of memory cells with nondestructive recall have been developed. For example, the memory cell described in the copending patent application filed by the present inventor entitled "Semiconductor Device for the Storage of Binary Data", Ser. No. 613,189, filed on Sept. 15, 1975, now U.S. Pat. No. 3,997,799, provides for nondestructive recall. Also memory cells with a minimum of three transistors have been developed which provide nondestructive recall. In the past dynamic semiconductor memory cells with nondestructive recall have not found widespread use because the disadvantages of prior art designs, such as the relatively large number of components required per memory cell, the relatively large power consumption of such memory cells, and the large area required per memory cell, outweigh the advantages.

Several different types of content addressable memory cells have also been developed in the prior art. For example, a five transistor memory cell for use in associative memories has been described by J. L. Mundy, J. F. Burgess, R. E. Joynson, and C. A. Neugebauer in the Digest of Technical Papers Presented at the 1972 IEEE International Solid-State Circuits Conference, pp. 58. A three transistor memory cell which is claimed functions as an associative memory cell despite the admitted limitation to searching only for 1's has been described by R. M. Lea in the IEEE Journal of Solid State Circuits, June 1975, pp. 179. Finally several nine transistor associative memory cells have been described by J. T. Koo in the IEEE Journal of Solid State Circuits, Vol Sc-5, October 1970, pp. 208. All of the above mentioned associative memory cells require considerable semiconductor surface area relative to the minimum size memory cells, and have not found widespread use.

SUMMARY OF THE INVENTION

Accordingly it is an object of this invention to provide a method of operating memory cells such that a dynamic memory cell with nondestructive recall can be implemented using minimized semiconductor surface area.

It is another object of this invention to provide a method of operating memory cells such that a dynamic memory cell with content addressing capability can be implemented using minimized semiconductor surface area.

This invention is an improvement of the method described in a copending patent by the present inventor filed on Dec. 22, 1975, Ser. No. 642,721, now U.S. Pat. No. 4,015,247, entitled "Method for Operating Charge Transfer Memory Cells". In one method of this invention, to operate a memory cell for use in content addressable memories, two additional electrodes are provided for the memory cells described in the patent application referred to above. To determine if the bit stored in the memory cell matches a key bit, a potential is applied to one or the other of these two additional electrodes, to form an inversion region and thereby extract mobile charge carriers stored in one of the two storage wells of the memory cell. The resulting potential change on the storage electrode indicates whether or not the datum stored in the memory cell matches the key datum. When these memory cells are to be used to form random access memories with nondestructive recall and with differential output, a potential is applied to both of these two additional electrodes and any potential changes on both of the storage electrodes is detected.

For use in random access memories without differential outputs, but with nondestructive recall, and for use in content addressable memories with limited capabilities, only one additional electrode is provided for the memory cells described in the aforementioned patent application.

In the following more detailed description of the preferred embodiments of this invention, other objects, features and advantages of the present invention will be demonstrated.

BRIEF DESCRIPTION OF THE DRAWINGS

FIG. 8 shows a top view of an alternative type of memory cell which can be operated according to the methods of this invention.

FIG. 9 shows a cross-sectional view of one memory cell of FIG. 8 taken along the line 9—9 of FIG. 8.

FIG. 10 shows in a cross-sectional view a variation on the memory cell of FIG. 8.

FIG. 11 shows a top view of a second variation on the memory cell shown in FIG. 8.

FIG. 12 shows a top view of a third variation on the memory cell shown in FIG. 8.

DESCRIPTION OF THE PREFERRED EMBODIMENTS

Figure 1:
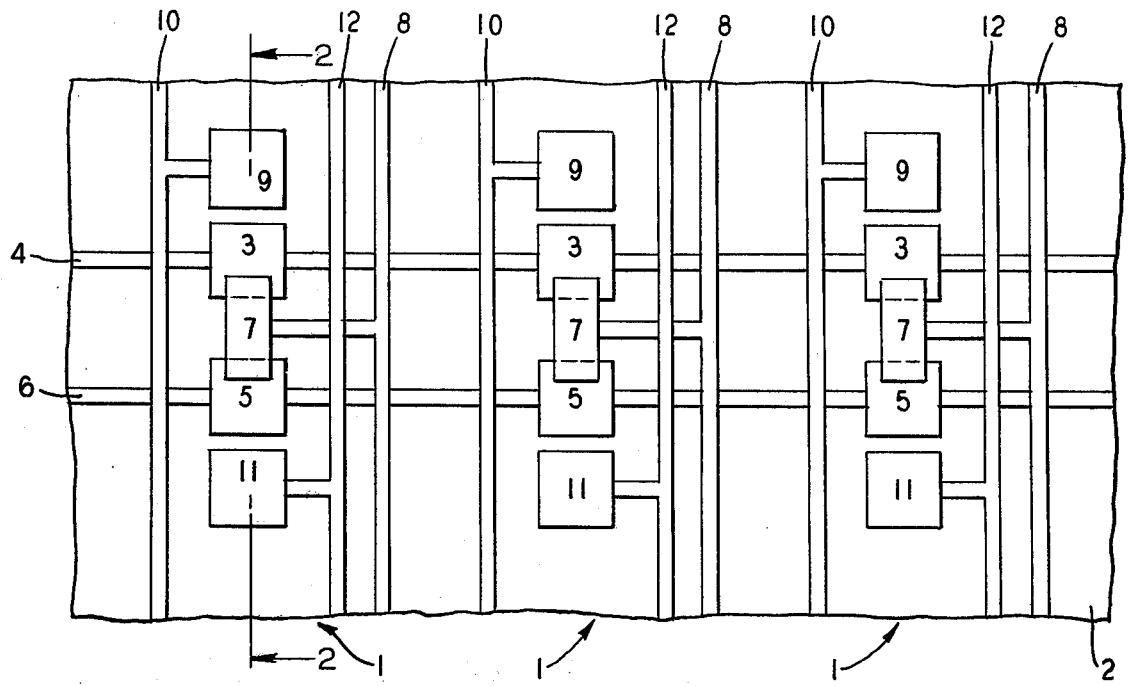
FIG. 1 shows a top view of a portion of a memory comprised of memory cells that can be operated according to the method of this invention.

In FIG. 1 a portion of one row of memory cells 1 taken from a two dimensional array of substantially identical memory cells 1 is shown. The memory cells 1 are formed on the substrate 2 and each memory cell 1 consists of a first storage electrode 3 connected to a first conductive row line 4, a second storage electrode 5 connected to a second conductive row line 6, and a gate electrode 7 connected to a conductive column line 8. Each memory cell 1 is also provided with a match zero electrode 9 which is connected to a conductive match zero column line 10, and with a match one electrode 11 which is connected to a conductive match one column line 12. The memory cells 1 in the array are disposed in rows and columns and each memory cell 1 appears in one row and in one column. In each row of memory cells 1, the first storage electrodes 3 of all those memory cells 1 appearing in that row are connected in common by means of one of the first row lines 4, and the second storage electrodes 5 of all those memory cells 1 appearing in that row are connected in common by means of one of the second row lines 6. Similarly, in each column of memory cells 1, the gate electrodes 7 of all those memory cells 1 appearing in that column are connected in common by means of one of the gate column lines 8, the match zero electrodes 9 of all those memory cells 1 appearing in that column are connected in common by means of one of the match zero column lines 10, and the match one electrodes 11 of all those memory cells 1 appearing in that column are connected in common by means of one of the match one column lines 12.

Figure 2:
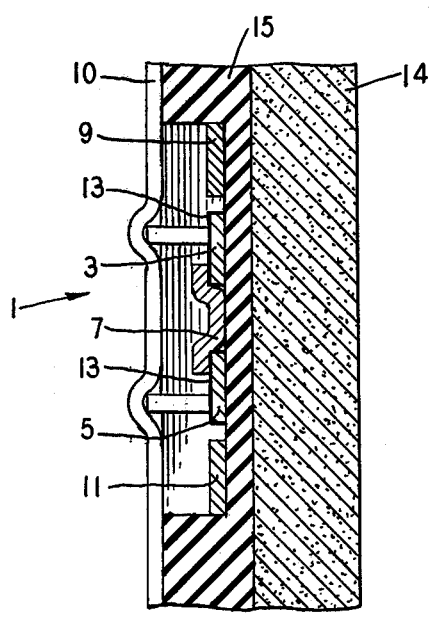
FIG. 2 shows a cross-sectional view of one memory cell of FIG. 1 taken along the line 2—2 of FIG. 1.

FIG. 2 shows a cross-sectional view of one memory cell 1 taken along line 2—2 of FIG. 1. The first storage electrode 3, the second storage electrode 5, the gate electrode 7, the match zero electrode 9, and the match one electrode 11 of one memory cell 1 are shown. The gate electrode 7 is shown overlapping the first and the second storage electrodes 3, 5, but insulated from those electrodes by a thin insulating layer 13. With the first and second storage electrodes 3, 5 so insulated by layer 13, the match zero electrodes 9 can overlap the first storage electrodes 3, and the match one electrodes 11 can overlap the second storage electrodes 5. The use of such overlapping electrodes in charge transfer devices to facilitate their manufacture is well known in the semiconductor art, and can be beneficially used in this and in the other memory cells described herein.

The semiconducting material 14 and the insulating material 15 which are common to all the memory cells described herein, are also shown in FIG. 2. The thickness of the insulating material 15 beneath the electrodes of the memory cell 1 is less than the thickness of the insulating material 15 in other regions, such as beneath the match zero column line 10.

In the following description of the memory cells shown in FIG. 3, 5, and 6, which are variations of the memory cell shown in FIG. 1 and 2, elements of these memory cells which are substantially identical to elements of the memory cell of FIG. 1 will be assigned the same reference numerals that were used for these elements in FIG. 1. Elements in these variations which perform the same function as, but in some respects differ from elements in the memory cell of FIG. 1 will be assigned the same reference numerals as were used for these elements in FIG. 1, but primes will be added to the reference numerals.

Figure 3:
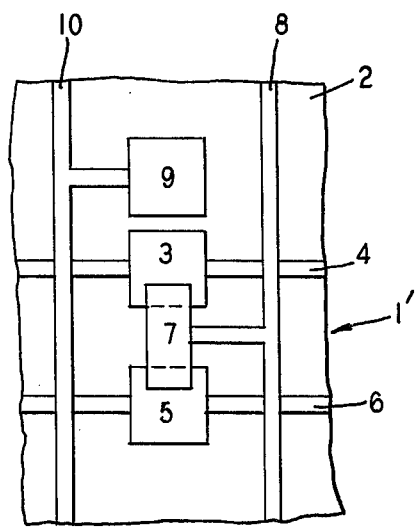
FIG. 3 shows a top view of a variation of the memory cell shown in FIG. 1.

FIG. 3 illustrates a memory cell 1' which can be operated according to the methods of this invention. The memory cell 1' differs from the memory cell 1 shown in FIGS. 1 and 2 only in that the match one electrode 11 and the match one column line 12 of FIG. 1 have been eliminated. In an array of such memory cells 1', the memory cells 1' are disposed in rows and columns as was described for the memory cell 1 of FIG. 1, and the electrodes 3, 5, 7, and 9 of FIG. 3 are interconnected as was explained in the description of the memory shown in FIG. 1.

Figure 4:
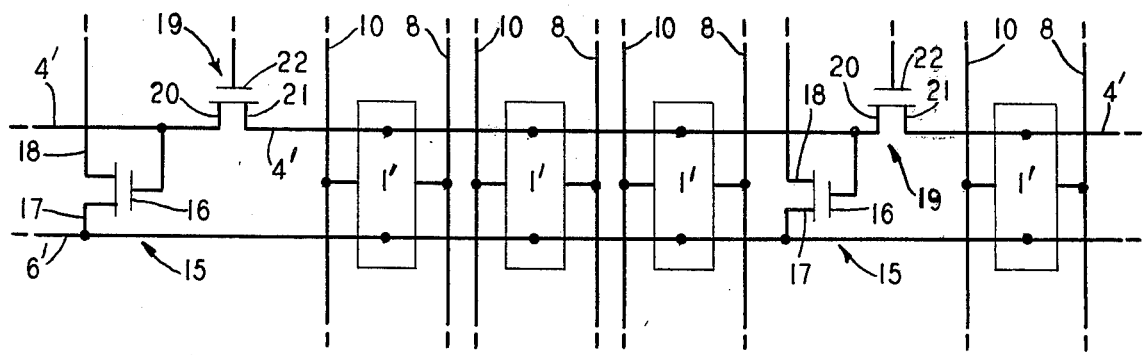
FIG. 4 illustrates schematically how distributed gain can be provided for memory cells operated according to the methods of this invention.

FIG. 4 shows a portion of one row of the memory cells 1' shown in FIG. 3 and illustrates how distributed gain can be provided for the memory cells 1'. Each row of memory cells 1' is divided in to subrows and the first storage electrodes 3 of all those memory cells 1' appearing in the same subrow are connected in common by means of a conductive subrow line 4'. A gain transistor 15 which can be an insulated gate field effect transistor, is provided for each subrow of memory cells 1'. The gate of the gain transistor 15 for a particular subrow of memory cells 1 is connected to the subrow line 4' of that particular subrow of memory cells 1', the source 17 is connected to the second row line 6 of that row of memory cells 1', and access to the drain terminal 18 is provided. The access transistors 19 which can be insulated gate field effect transistors, bridge adjacent subrow lines 4' — the source 20 of one access transistor 19 is connected to one subrow line 4', and the drain 21 is connected to an adjacent subrow line 4' in the same row. Access to the gate terminal 22 is provided.

Figure 5:
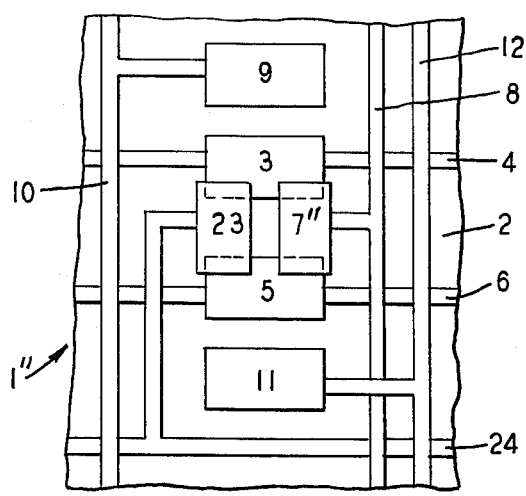
FIG. 5 shows a top view of a second variation on the memory cell shown in FIG. 1.

FIG. 5 shows a top view of a memory cell 1" which differs from the memory cell 1 shown in FIG. 1 in that a second gate 23 has been provided. The second gate 23 is shown connected to a row gate line 24. In a memory array comprised of a plurality of memory cells 1", the memory cells 1" are disposed in rows and columns with each memory cell 1" appearing in one row and in one column. The electrodes 3, 5, 7", 9, and 11 of each memory cell 1" in the array are connected to the like electrodes of other memory cells 1" in the array as was explained in the description of the memory shown in part in FIG. 1. In each row of memory cells 1", the second gates 23 of all those memory cells 1" appearing in that row are connected in common by means of one of the plurality of third conductive row lines 24.

There are certain advantages, which will be described later, of doping very thin layers of the semiconducting material 14 near the interface between the semiconducting material 14 and the insulating material 15 to be of the opposite conductivity type as is the bulk of the semiconducting material 14, by means of, for example, ion implantation. FIG. 6 shows a cross-sectional view of a memory cell 1'" which can be operated according to the methods of this invention. This memory cell 1'" is similar to the memory cell 1 shown in FIGS. 1 and 2, but in the memory cell 1''' of FIG. 6 the semiconducting regions 25 and 26 in the semiconducting material 14, generally beneath the first and second storage electrodes 3, 5 have been formed by doping the semiconducting material 14 in these regions to be of the opposite conductivity type as the semiconducting material 14.

Figure 7:
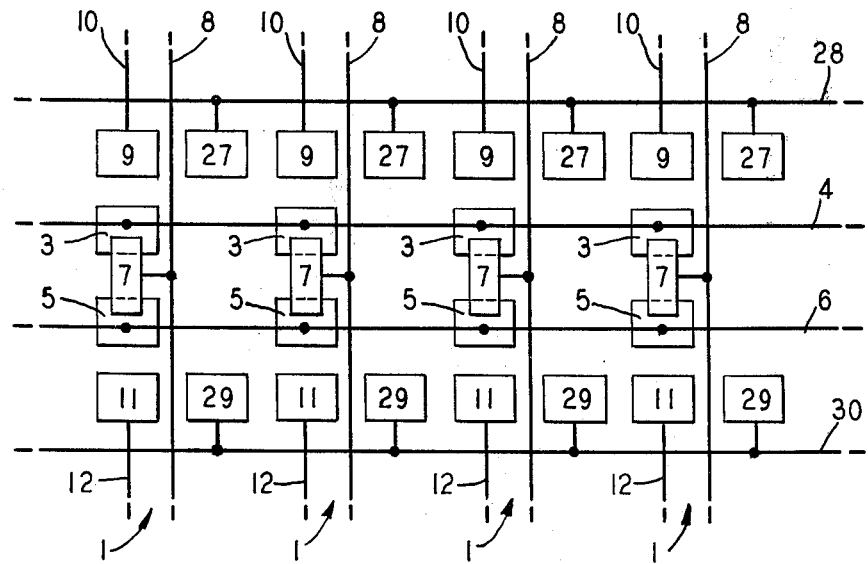
FIG. 7 shows a top view of a portion of an array of memory cells according to FIG. 1 in which an alternative means for entering data in the memory cells is provided.

FIG. 7 shows schematically a portion of one row of an array of memory cells 1, in which a plurality of first transfer electrodes 27 are provided for each row. The first transfer electrodes 27 alternate with the match zero electrodes 9, and all of the first transfer electrodes 27 in each row are connected in common by means of one of a plurality of first transfer row lines 28. The first transfer electrodes 27 of each row, together with the match zero electrodes 9 of that row, form a charge coupled shift register. Similarly, a plurality of second transfer electrodes 29 alternating with the match one electrodes 11, are provided for each row of memory cells 1, and second transfer row lines 30 connect in common all of the second transfer electrodes 29 in each particular row. In each row, the second transfer electrodes 29, together with the match one electrodes 11 of that row form a charge coupled shift register.

In FIG. 8 a portion of one row of memory cells 31 taken from a two dimensional array of substantially identical memory cells 31 is shown. The memory cells 31 are formed on the substrate 32 and each memory cell 31 consists of a first storage electrode 33 connected to a first conductive row line 34, a second storage electrode 35 connected to a second conductive row line 36, a gate electrode 37 connected to a third conductive row line 38, a match zero electrode 39 connected to a match zero column line 40, and a match one electrode 41 connected to a match one column line 42. The memory cells 31 in the array are disposed in rows and columns and each memory cell 31 appears in one row and in one column. In each row of memory cells 31, the first storage electrodes 33 of all those memory cells 31 appearing in that row are connected in common by means of the first row lines 34, the second storage electrodes 35 of all those memory cells 31 appearing in that row are connected in common by means of the second row lines 36, and the gate electrodes 37 of all those memory cells 31 appearing in that row are connected in common by means of the third row lines 38. Similarly, in each column of memory cells 31, the match zero electrodes 39 of all those memory cells 1 appearing in that column are connected in common by means of the match zero column lines 40, and the match one electrodes 41 of all those memory cells 31 appearing in that column are connected in common by means of the match one column lines 42.

The memory cells 31 of FIG. 8 differ from the memory cells 1 of FIG. 1 in that the relative positions of the storage electrodes and the match electrodes have been interchanged, and in that the gate electrodes 7 of any particular memory cell 1 in FIG. 1 is connected in common with the gate electrodes 7 of other memory cells 1 in the same column as that particular memory cell 1, while the gate electrode 37 of any particular memory cell 31 of FIG. 8 is connected in common with the gate electrodes 37 of other memory cells 31 in the same row as that particular memory cell 31.

FIG. 9 shows a cross-sectional view of one memory cell 31 taken along line 9—9 of FIG. 8. The first storage electrode 33, the second storage electrode 35, the gate electrode 37, the match zero electrode 39, and the match one electrode 41 of one memory cell 31 are shown. The gate electrode 37 is shown overlapping the match zero and the match one electrodes 39, 41, but insulated from those electrodes by a thin insulating layer 43. With the match zero and match one electrodes 39, 41 so insulated, the first storage electrode 33 can overlap the match zero electrode 39, and the second storage electrode 35 can overlap the match one electrode 41. The semiconducting material 44 and the insulating material 45 are common to all the memory cells described herein. As shown in FIG. 9, the thickness of the insulating material 45 beneath the electrodes of the memory cell 31 is less than the thickness of the insulating material 45 in other regions, such as beneath the match zero column line 40.

In the following description of the memory cells shown in FIGS. 10, 11 and 12, which are variations of the memory cell 31 shown in FIGS. 8 and 9, elements of these memory cells which are substantially identical to elements of the memory cells 31 of FIG. 8 will be assigned the same reference numerals that were used for these elements in FIG. 8. Elements in these variations which perform the same function as, but in some respects differ from, elements in the memory cell 31 shown in FIG. 8 will be assigned the same reference numerals as were used for these elements in FIG. 8, but primes will be added to the reference numerals.

The memory cell 31' shown in FIG. 10 is similar to the memory cell 31 of FIGS. 8 and 9, but the first and second storage regions 46, 47 in the semiconducting material 44 generally beneath the first and second storage electrodes 33, 35, respectively, have been formed by doping these regions to be of the opposite conductivity type as is the remainder of the semiconducting material 44. In an array of these memory cells 31', the electrodes 33, 35, 37, 39 and 41 are interconnected in the same manner as the corresponding elements in the array of memory cells 31 of FIG. 8.

The memory cell 31'' shown in FIG. 11 is similar to the memory cell 31 of FIGS. 8 and 9, but the match one electrodes 41, and the match one column lines 42 of the memory cells 31 of FIG. 8 are eliminated. In an array comprised of these memory cells 31'', the electrodes 33, 35, 37, and 39 of each memory cell 31'' are interconnected in the same way that in arrays of memory cells 31, the electrodes 33, 35, 37, and 39 of each memory cell 31 are interconnected.

The memory cell 31''' shown in FIG. 12 is similar to the memory cell 31 of FIGS. 8 and 9, but a diffused row line 48 is provided for each row of memory cells 31''', and the second storage electrodes 35, the match one electrodes 41, the second row lines 36, and the match one column lines 42 of the memory cells 31 shown in FIG. 1 are eliminated. The diffused row lines 48 are of the opposite conductivity type as is the bulk of the semiconducting material.

In the method of this invention, mobile charge carriers of one polarity in the semiconducting material 14, 44 are manipulated by controlling the potentials applied between the semiconducting material 14, 44 and the electrodes in proximity thereto. The potentials applied to these electrodes establish within the semiconducting material 14, 44, at the interface between the semiconducting material 14, 44 and the insulating material 15, 45, localized regions of minimum potential energy for said polarity of mobile charge carriers. If the doping in the region in which the localized minimum potential energy region is formed is such that majority carriers accumulate therein, it is called an accumulation region.

Conversely, if minority carriers accumulate in the localized minimum potential energy region, it is called an inversion region. In some cases however, the distinction between inversion regions and accumulation regions is blurred, and partly for this reason the precise, but awkward phrase "localized regions of minimum potential energy for one polarity of mobile charge carriers" is used. In the interest of brevity, such localized minimum potential energy regions will also be called "potential wells", although the term is less precise.

The memory cells 1, 1', 1'', 1''' of FIGS. 1, 3, 5, and 6, and the memory cells 31, 31', 31'', and 31''' of FIGS. 8, 10, 11, and 12 are comprised of a plurality of electrodes by means of which potential wells are formed in a semiconducting material, means for insulating the electrodes from the semiconducting material, and means for interconnecting said electrodes. In the semiconductor art, and in particular in the silicon integrated circuit art, the materials and techniques for constructing elements to perform these functions is well known and need not be detailed here. However in describing the operation of the memory cells according to this invention, it is convenient to consider a specific case. Therefore in the following discussion it will be assumed that the semiconducting material 14, 44 is N-type silicon of conductivity between 1 and 10 ohm-cm, the insulating material 15, 45 is silicon dioxide of a thickness between 1000 Angstroms and 1200 Angstroms in the regions beneath the electrodes, and of a thickness of approximately 10,000 Angstroms in other regions. The first and second storage electrodes 3, 5 as well as the first and second row conductive means 4, 6, and the match zero and match one electrodes 39, 41 as well as the match zero and match one column lines 40, 42 are polysilicon. The insulating layers 13, 43 are then silicon dioxide formed by oxidizing the surface of the polysilicon. The gate electrodes 7, 7'', and 23, the match zero and match one electrodes 9, 11, and the match zero and match one column lines 10, 12 are aluminum. Also, the first and second storage electrodes 33, 35, the first and second row lines 34, 36, the gate electrode 37, and the third row conductive line 38 are aluminum. The gate column line 8 and the third conductive row line 24 which intersect both the row lines and the column lines can be formed of polysilicon where they pass under the column lines and of aluminum elsewhere. The transfer electrodes 25, 27 can be of polysilicon as can the transfer lines 26, 28.

Of course other semiconducting materials such as P-type silicon and other insulating materials or combinations of insulating materials such as silicon nitride and silicon dioxide can be used in these memory cells, and all the electrodes can be of polysilicon. Also diffused regions of opposite conductivity type to the semiconducting material 14, 44 can be used as means for interconnecting some of the various electrodes. The operation of the memory cells described herein is based in part on charge transfer principles, and many of the techniques which have been developed in the prior art to improve the performance of charge coupled devices, such as ion implantation to control the threshold voltage, and the use of channel stops, can be used in these memory cells. Such techniques are well known in the semiconductor art, and will not be described herein.

The description of the operation of the memory cells according to this invention, is simplified if it is assumed that the semiconducting material 14, 44 is held at ground potential and that the voltages which are in fact applied between the various electrodes and the semiconducting material 14, 44 are described as being applied to the electrode of interest. In practical embodiments, and especially in those cases wherein electrons are the charge carriers which are used to represent data, it may be desirable to bias the semiconducting material 14, 44. Since the use of such biases to control the threshold voltage is well known in the semiconductor art, the use of such biases will not be described herein.

With reference to FIGS. 1 and 2, the operation of an individual memory cell 1 will be described first, and thereafter, the operation of an array of such memory cells 1 will be considered. The operation of the memory cell 1 according to the methods of this invention will be described in detail. With this description as a basis, the operation of the other memory cells will be more briefly described by indicating the principal differences between these alternative and modified memory cells and the memory cell 1 of FIGS. 1 and 2.

In the memory cell 1 shown in FIGS. 1 and 2, binary data is represented by the density of mobile holes stored in the potential wells beneath the first and second storage electrodes 3, 5. Since the semiconducting material is N-type, these potential wells are inversion regions. These and similar inversion regions will be referred to herein as the inversion region beneath a specific electrode, it being understood that the inversion region is in fact located in the semiconducting material 14 at the interface between the insulating material 15 and the semiconducting material 14. These inversion regions can be formed by applying the appropriate potentials to the electrodes, and in the semiconductor art the conditions for the formation of such inversion regions are well known.

Let the potential $V_r$ be applied to the first and second storage electrodes 3, 5 to establish inversion regions in the semiconducting material 14 beneath these electrodes. Then a 1 is represented by storing a relatively large number of holes in the inversion region beneath the first storage electrode 3, and storing a relatively small number of holes in the inversion region beneath the second storage electrode 5. Conversely, a zero is represented by storing a relatively small number of holes in the inversion region established beneath the first storage electrode 3, and storing a relatively large number of holes in the inversion region beneath the second storage electrode 5.

In some memory cells, the mobile carriers required for the operation of the memory cell can be maintained in the memory cell even when all the electrodes are at ground potential. But in other memory cells, potentials must be applied to at least one of the electrodes to form the potential wells required to maintain the mobile carriers necessary for the operation of the memory cell. However, once a sufficient number of mobile carriers have been collected in the memory cell, they are retained therein until all the potential wells are again extinguished. Therefore in these memory cells, the accumulation of mobile carriers — generated thermally, by ionizing radiation, or otherwise — is only required when the memory cell is first used after it has been turned "off" for a significant length of time.

To retain datum in the memory cell 1, the potential $V_r$ is maintained on both the first and second storage electrodes 3, 5. The enter, recall, match, and refresh operations all begin with and end with the memory cell 1 in the datum retention mode.

To enter a one in the memory cell 1, inversion regions are formed beneath the first and second storage electrodes 3, 5 such that when a minority carrier channel is formed between them, most of the holes within the memory cell 1 accumulate in the inversion region beneath the first storage electrode 3. These inversion regions can be formed by applying a negative potential $V_h$ to the first storage electrode 3, and applying a negative potential $V_l$, of magnitude less than the magnitude of $V_h$, to the second storage electrode 5. The minority carrier channel can be formed by applying the negative potential $V_g$ to the gate electrode 7. After the required distribution of holes has been established in the two inversion regions, the minority carrier channel is extinguished by, for example, grounding the gate electrode 7. Then the potential $V_r$ is applied to both the first and second storage electrodes 3, 5. To enter a zero in the memory cell 1, a similar operation is used, but $V_h$ is applied to the second storage electrode 5, and $V_1$ is applied to the first storage electrode 3.

The memory cell 1 can function both as a random access memory cell with nondestructive recall and as a content addressable memory cell. The method of representing, entering, and retaining binary datum described above is used regardless of the function of the memory cell 1. However, the recall operation, used when the memory cell is used as a random access memory cell, differs from the match operation, used when the memory cell 1 functions as a content addressable memory cell.

A process called interrogation is used in both the recall and the match operations. An electrode is interrogated by performing operations to determine the number of holes stored in the inversion region beneath that electrode. For example, to interrogate the first storage electrode 3, a third inversion region is formed by applying a potential to the match zero electrode 9. This third inversion region interacts with the inversion region maintained beneath the first storage electrode 3, and some of the holes stored in the inversion region beneath the first storage electrode 3 transfer to the said third inversion region. This hole transfer changes the capacitance of the MIS capacitor formed by the first storage electrode 3, the insulating material 15, and the semiconducting material 14. The magnitude of this capacitance change is indicative of the number of holes which have transferred out of the inversion region beneath the first storage electrode 3. Therefore, by applying a potential to the match zero electrode 9 such that most of any holes stored in the inversion region beneath the first storage electrode 3, transfer to the inversion region beneath the match zero electrode 9, the change in the capacitance of the first storage electrode 3 indicates whether a relatively large or a relatively small number of holes were stored in the inversion region beneath the first storage electrode 3. A relatively large change in the capacitance of the first storage electrode 3 indicates a relatively large number of holes were stored in the inversion region beneath the first storage electrode 3, and a relatively small capacitance change indicates a relatively small number of holes were stored therein. By relaxing the potential on the match zero electrode 9, the inversion region formed beneath the match zero electrode 9 is extinguished and most of any holes which has transferred from the inversion region beneath the first storage electrode 3 to the inversion region beneath the match zero electrode 9 transfer back to the inversion region beneath the first storage electrode 3. This second hole transfer also changes the capacitance of the first storage electrode 3, and this change can also be used to determine the relative number of holes stored in the inversion region beneath the first storage electrode 3. The above process — the transfer of stored holes from one inversion region to a neighboring inversion region and back again while detecting the resulting changes in the capacitance of the MIS capacitor of which the first inversion region is part of — is the "interrogation process". In the above example, the first storage electrode 3 was interrogated by the match zero electrode 9.

By maintaining a constant charge on the electrode of the MIS capacitor during the interrogation process, the change in the capacitance of the MIS capacitor resulting from it's interrogation, produces a change in the potential across that MIS capacitor. With an isolated memory cell 1 the charge on the electrode of the MIS capacitor being interrogated can be held constant by, just prior to the interrogation, connecting the input terminal of a high impedance sense amplifier to that electrode and then removing the potential source $V_r$ from that electrode. In practical embodiments, the memory cells 1 are used in arrays and the first and second storage electrodes 3, 5 of a particular memory cell 1 are capacitively loaded by the first and second row lines 4, 6 and by the first and second storage electrodes 3, 5 of those memory cells 1 which are in the same row as that particular memory cell 1. Therefore in practical embodiments, a load capacitor is always in parallel with the MIS capacitor being interrogated, and the charge on the electrode of that MIS capacitor cannot be kept constant during the interrogation process. Instead, the sum of the charge on the electrode of that MIS capacitor and that terminal of the load capacitor which is connected in common with the electrode of that MIS capacitor, is kept constant during the interrogation process by, just prior to interrogation, removing the potential source $V_r$ from both the MIS capacitor and the load capacitor, leaving them charged at approximately the potential $V_r$. During the interrogation process, if the capacitance of the MIS capacitor changes, there will be a redistribution of charge between the MIS capacitor and the load capacitor. For a given change in the capacitance of the MIS capacitor, the resulting potential change on the loaded MIS capacitor is therefore less than the potential change would be on an unloaded MIS capacitor. However, this reduced potential change can still be detected by means of a high impedance sense amplifier connected to the electrode of the MIS capacitor being interrogated.

The capacitance of a MIS capacitor in which holes are stored changes twice during the interrogation process — once when holes are extracted and once when the holes are re-entered. Either one or both of these capacitance changes can be used to determine the relative number of holes stored in the inversion region being interrogated. The description of how the capacitance change of the MIS capacitor being interrogated can be used to produce a potential change across that MIS capacitor assumed that the capacitance change resulting from the removal of holes was being used to determined the number of holes in that inversion region. A similar technique can be used if the capacitance change resulting from the re-entering of those holes which just previously were removed, is used to determine the relative number of holes stored in the inversion region. Which of these capacitive changes is used to determine the number of holes in an inversion region depends in part on the peripheral circuits used with the memory. In the following description of the methods of this invention, in the interest of brevity, it will be assumed that in the interrogation process, the initial capacitance change is used to determine the number of holes stored in the inversion region being interrogated.

When binary datum is stored in the memory cell 1, the number of holes stored in that one of the inversion regions beneath the storage electrodes 3, 5 in which a relatively small number of holes is stored can be sufficiently large that in the interrogation process when these holes are transferred out of that inversion region, there will be a significant potential change on the electrode associated with that inversion region. Although this potential change will be smaller than the potential change resulting from the interrogation of that one of the inversion regions beneath the storage electrodes 3, 5 in which a relatively large number of holes is stored, even this relatively small potential change can introduce problems, especially in content addressable memories during the match operation. These extraneous holes exist in the inversion region in which a relatively small number of holes are stored either because the difference between $V_h$ and $V_l$ is not adequate to remove almost all of the holes from one of the inversion regions during the enter operation, or because thermally generated holes accumulate in this inversion region during the intervals between refreshing. To minimize this undesired potential change, the maximum number of holes ever stored in the inversion region in which a relatively small number of holes is stored should be minimized by maximizing the difference between $V_h$ and $V_l$, and by the use of frequent refreshing. Also the interrogation process can be designed such that not all of the holes stored in an inversion region are transferred when that inversion region is interrogated. In particular, if the interrogation process is designed such that only holes in excess of the number of extraneous holes expected in a nominally empty inversion region are transferred, then the existence of the extraneous holes in the nominally empty inversion region does not result in a capacitance change when the inversion region is interrogated.

When the memory cell 1 is used as a random access memory cell, to recall the datum stored therein, both the first and the second storage electrodes 3, 5 are interrogated simultaneously by applying appropriate potentials to the match zero and match one electrodes 9, 11. Using the detection technique described above, if a one is stored in the memory cell 1, there is a relatively large change in the potential of the first storage electrode 3, and a relatively small change in the potential of the second storage electrode 5. By symmetry, if a zero is stored in the memory cell 1, the potential change on the first storage electrode 3 is relatively small and the potential change on the second storage electrode 5 is relatively large. Therefore by monitoring the potentials on both the first and the second storage electrodes 3, 5 a differential output signal indicative of the datum stored in the memory cell 1 is obtained. Since the interrogation process is nondestructive, the recall operation is nondestructive.

When the memory cell 1 is used as a content addressable memory cell, instead of recalling the datum stored therein, it must be determined whether or not the datum stored in the memory cell 1 is identical to a given datum. This operation is called the match operation, and the output signal from the memory cell 1 indicates whether or not the datum stored therein matches the given datum. If the given datum is a one, the second storage electrode 5 of the memory cell 1 is interrogated by applying an appropriate potential to the match one electrode 11. Then if the memory cell 1 contains a one, the potential change on the second storage electrode 5 will be relatively small. If the memory cell 1 contains a zero, a relatively large potential change will occur on the second storage electrode 5. Similarly, if the given datum is a zero, the first storage electrode 3 is interrogated using the match zero electrode 9. Regardless of what the given datum is, a match between the given datum and the datum stored in the memory cell 1 is indicated by the absence of any relatively large potential change on both the first and the second storage electrodes 3, 5. p The datum stored in the memory cell 1 must be periodically refreshed, since thermally generated holes tend to accumulate in that one inversion region in which a relatively small number of holes is stored — the "empty" inversion region. To refresh the memory cell 1 the datum stored therein is recalled, and then re-entered in a manner such that most of any thermally generated holes which had accumulated in the "empty" inversion region transfer to the full inversion region. Then the potential $V_r$ is established on both the first and second storage electrodes 3, 5, and any excess holes in the full inversion region slowly recombine, thereby diminishing the total number of holes stored in the inversion regions of the memory cell 1 and counteracting the effects of thermal generation. It is not necessary to wait until all of any excess holes in the full inversion region have recombined before the memory cell 1 can be used for operations such as match, recall, and enter.

For example, to refresh a memory cell 1 in which there are $P_1$ holes in the inversion region beneath the first storage electrode 3, and $P_2$ holes in the inversion region beneath the second storage electrode 5, the datum stored in the memory cell is first recalled. If it is determined that a one is stored in the memory cell 1, then $P_1$ is greater than $P_2$, and some of the holes in the inversion region beneath the second storage electrode 5 must be transferred to the inversion region beneath the first storage electrode 3, and thereafter be recombined. So the potential $V_h$ is applied to the first storage electrode 3, and the potential $V_l$ is applied to the second storage electrode 5. Then a minority carrier channel is formed between these two inversion regions by applying a potential $V_g$ to the gate electrode 7. Some of the holes, say $P_3$, in the inversion region beneath the second storage electrode 5 flow to the inversion region beneath the first storage electrode 3. Then the minority carrier channel is extinguished by, for example, grounding the gate electrode 7, and finally the potential $V_r$ is re-established on both the first and the second storage electrodes 3, 5.

Now the number of holes in the inversion region beneath the first storage electrode 3 is $P_1 + P_3$ and the number of holes in the inversion region beneath the second storage electrode 5 is $P_2 - P_3$. If in steady state with the first storage electrode 3 at potential $V_r$, the number of holes that can be stored in the inversion region beneath the first storage electrode 3 is greater than $P_1 + P_3$, then no holes need recombine. Eventually, after a series of refresh operations, the number of holes in the inversion region beneath the first storage electrode 3 will build up until in a subsequent refresh operation, the number of holes that can be stored therein in steady state is exceeded. If in steady state, with the first storage electrode 3 at potential $V_r$, the number of holes that can be stored in the inversion region beneath the first storage electrode 3 is less than $P_1 + P_3$, then some of the excess holes will recombine. It is important however, that $P_3$ not be so large that all the holes $P_1 + P_3$ cannot be at least temporarily maintained in the inversion region beneath the first storage electrode 3 when $V_r$ is applied thereto. This requirement determines in part the maximum interval between refresh cycles.

An analogous procedure is used to refresh a memory cell 1 containing a zero, with the roles of the first and second storage electrodes 3, 5, just reversed.

The physical layout of the memory cell 1 can be optimized for minimum cell size by using the minimum size electrodes possible with current photolithographic techniques. Alternatively, by using larger electrodes, the performance can be enhanced. For example to improve the output signal from the memory cell 1, the size of the first and second storage electrodes 3, 5 can be made sufficiently large that the capacitive loading of the first and second row lines 4, 6 is negligible. Or using given operating voltages, the size of the match one and match zero electrodes 9, 11 relative to the size of the storage electrodes 3, 5 can be used to control the fraction of the holes stored in the inversion regions which are extracted in the interrogation process.

An example is useful in illustrating some of the above considerations. In this example, let the semiconducting material 14 be silicon doped with $10^{15}$ phosphorus atoms per cubic centimeter oriented such that the (111) surface is parallel to the interface between the semiconducting material 14 and the insulating material 15. Also let the insulating material 15 beneath the electrodes be silicon dioxide of 1000 A thickness. The first and second storage electrodes 3, 5 are polysilicon and the gate electrode 7 and the match zero and match one electrodes 9, 11 are aluminum. Partly to minimize the number of different potentials that must be supplied to the memory cell 1, and more importantly for reasons that will be discussed when an array of memory cells 1 is considered, $V_1$ will be set equal to $V_r$. The first and second storage electrodes 3, 5 are the same size as the match zero and match one electrodes 9, 11.

Then depending on the choice of the potentials $V_r$ and $V_h$, the memory cell 1 can operate in either of two modes.

In the first mode, the nominally empty inversion region beneath one of the storage electrodes 3, 5 is almost completely depleted of holes when datum is entered in the memory cell 1, and very few holes are permitted to accumulate in this inversion region in the interval between refresh cycles. To enter a one in the memory cell 1 the potential $V_h$ is applied to the first storage electrode 3, and the potential $V_1$ is applied to the second storage electrode 5. The difference between $V_h$ and $V_1$ must be sufficiently large that almost all of the holes in the memory cell 1 accumulate beneath the first storage electrode 3 when a minority carrier channel is formed between the two storage inversion regions. From well known relations, the above requirement is met if $$V_h = 2V_r - \phi_w + Q_{ss}/C_o$$

where $\phi_w$ is the work function difference between the polysilicon and the silicon, $Q_{ss}$ is the ionized surface charge density, and $C_o$ is the oxide capacitance per cm$^2$. Using typical values for these parameters, the relation becomes $$V_h = 2V_r + 1.68$$

To maximize the output signal from the recall operation, the magnitude of $V_r$ should be maximized. But according to the above relation, as the magnitude of $V_r$ is increased, the magnitude of $V_h$ must be increased. Eventually $V_h$ is limited by high field breakdown and field inversion. A reasonable value for $V_h$ is $-15$ volts, and from the above relation $V_r$ can then be about $-8.5$ volts.

In steady state, the surface density of holes in the inversion region beneath the first storage electrode 3 with $-8.5$ volts thereon is $1.31 \times 10^{12}$ holes per cm$^2$. The maximum density of holes that can be maintained in this inversion region, without overflow, at $-8.5$ volts is $1.49 \times 10^{12}$ holes per cm$^2$. Therefore the memory cell 1 must be refreshed before $1.8 \times 10^{11}$ holes per cm$^2$ have accumulated in the normally empty inversion region.

The recall and match operations can be performed by applying $-15$ volts to the match zero and match one electrodes 9, 11 and for typical values of the loading capacitance it is easily shown that virtually all of the holes in the inversion regions beneath the first and second storage electrodes 3, 5 are transferred out during the interrogation process. If the area of the storage electrode is $50 \times 10^{-8}$ cm$^2$, and the loading capacitance is 0.16 pF, then with a one stored in the memory cell 1, during the recall process the potential on the first storage electrode 3 changes by about 0.5 volts and the potential change on the second storage electrode 5 is less than 0.1 volt.

In the second mode of operation, a significant number of holes are always stored in that inversion region in which a relatively small number of holes is stored.

In an array of memory cells 1, the method of representing binary data and the methods of entering, retaining, recalling, matching, and refreshing data described for the isolated memory cell 1 are unchanged, but the interconnection of the memory cells 1 places the following additional constraints on these operations.

First, when entering datum in one memory cell 1, the potential $V_1$ is applied to either the first row line 4 or the second row line 6, and therefore to all of either the first or second storage electrodes 3, 5 in one row of memory cells 1. Therefore $V_1$ must be selected so that when it is applied to either of the storage electrodes 3, 5 the inversion region so formed is capable of storing, at least temporarily, the maximum number of holes that will ever be stored in an inversion region beneath the first or second storage electrodes 3, 5 during normal operation. One method of meeting this requirement is to let $V_1 = V_r$.

Second, when entering datum, or refreshing datum, in a particular memory cell 1, a potential $V_g$ is applied to the gate column line 8 which is connected to that particular memory cell 1, and thus to the gate electrodes 7 of a complete column of memory cells 1. To prevent the loss of data from these memory cells 1, the first and second row lines 4, 6 of all these memory cells 1 must be held at the appropriate potentials, so that the number of holes stored in the inversion regions beneath the first and second storage electrodes 3, 5 of those memory cells 1 in the same column as the particular memory cell 1 are not substantially altered. To accomplish this, the data in that column of memory cells 1 is first recalled, and this data is re-entered in those memory cells 1 when the new datum is entered in that one particular memory cell 1.

Third, the data refresh operation must be such that the excess holes transferred to the "full" inversion region do not flow to the potential wells of adjacent memory cells 1. That is, the maximum number of holes ever entered in either the inversion region beneath the first or the second storage electrodes 3, 5 must be sufficiently small so that they can all be stored in either one of the potential wells established when $V_r$ is applied to the first and second storage electrodes 3, 5. If this were not the case, then when refreshing a memory cell 1 containing, for example, a one, some holes which had been attracted to the inversion region beneath the first storage electrode 3 when the potential $V_h$ was applied thereto, would be repelled from the region beneath the first storage electrode 3 when the potential $V_r$ was applied thereto. These repelled holes could flow to the potential wells of nearby memory cells 1, and interfere with the proper operation thereof. This requirement limits the maximum refresh interval and limits the minimum value of $V_r$.

In an array, when recalling data, the data in a complete column of memory cells 1 can be recalled simultaneously. Also data can be entered in a complete column of memory cells 1 simultaneously, and a complete column of memory cells 1 can be refreshed simultaneously.

When an array of memory cells 1 is being operated as a content addressable memory, the ordered series of bits stored in each row of memory cells 1 forms a word. Using the match operation, the memory can be rapidly searched to determine if any word stored in the memory array matches a given word. For example, if the memory array is comprised of M rows and five columns of memory cells 1, then each word consists of a series of five bits. To determine if, for example, the word 101X0, where X means don't care (i.e. either a one or a zero is acceptable) is stored in the memory, appropriate potentials are simultaneously applied to the match one column lines 12 in the first and in the third columns of memory cells 1, and to the match zero column lines 10 in the second and fifth columns of memory cells 1 such that the second storage electrodes 5 of every memory cell 1 in the first and third columns of memory cells 1, and the first storage electrodes 3 of every memory cell 1 in the second and fifth columns of memory cells 1 are simultaneously interrogated. The first and second row lines 4, 6 of each row of memory cells 1 is monitored and a match between the given word and the word stored in a particular row of memory cells 1 is indicated by the absence of a relatively large potential change on both the first and second row lines 4, 6 of that particular row of memory cells 1. Note that no potential was applied to either the match zero column line 10 or to the match one column line 12 of the fourth column of memory cells 1, since the fourth bit in the given word was not specified.

From the description of the match operation for an isolated memory cell 1, and the above description of the match operation for a particular word in a particular array of memory cells 1, the match operation for any word in any array of memory cells 1 can be readily understood by those familiar with the semiconductor art.

The memory cell 1' shown in FIG. 3 has been formed by eliminating the match one electrode 11 and the match one column line 12 of the memory cell 1 of FIG. 1. The operation of the memory cell 1' is similar to the operation of the memory cell 1, but only the first storage electrode 3 can be interrogated. Therefore in the recall process a differential output is not available, and the datum stored in a memory cell 1' is determined by monitoring the first storage electrode 3 when it is interrogated. A relatively large potential change on the first storage electrode 3 indicates that a one is stored in the memory cell 1', and a relatively small potential change thereon indicates that a zero is stored therein. In an array of such memory cells 1' which is operated as a content addressable memory, only the match zero process can be performed simultaneously on a plurality of memory cells 1' in the same row. Recognizing that during a match zero operation, a no match signal on the first storage electrode 3 of a memory cell 1' indicates that the datum stored therein matches a one, and that the first storage electrodes 3 of all the memory cells 1' in one row are "or" tied, the match one operation can be performed on a column of memory cells 1' at a time using the match zero operation. The advantage of the memory cell 1' is that it requires less substrate 2 surface area than does the memory cell 1.

In arrays of memory cells 1' of the type shown in FIG. 3, when recalling the datum stored in a particular memory cell 1', the output signal therefrom is severely degraded by the capacitive load on the storage electrode 3 of that memory cell 1'. FIG. 4 shows how an improved output signal can be obtained by reducing the capacitive loading of the storage electrodes 3. In particular the memory cells 1' in each row are divided into subrows, and the first storage electrodes 3 of all the memory cells 1' in each subrow are connected in common by means of one of a plurality of subrow lines 4'. One of a plurality of access transistors 19 is connected between adjacent subrow lines 4' in each row of memory cells 1'. During the recall process, the access transistors 19 are turned off by applying an appropriate potential to the gate terminal 22 thereof. The first storage electrode 3 of a particular memory cell 1' is then interrogated and the output signal therefrom is applied to the gate 16 of one of the gain transistors 15. By monitoring the second row line 6 of that row of memory cells 1' in which the particular memory cell 1' appears, the state of that one of the gain transistors 15 can be determined. The potential applied to the second row line 6 and the potential applied to the drains 18 of the gain transistors 15 can be selected so that with the potential $V_r$ on the gates 16, the gain transistors 15 are off. Then only a relatively large potential change on the first storage electrode 3 of the memory cell 1' being interrogated will turn one of the gain transistors 15 on. It is relatively easy to detect one on gain transistor 15 among the plurality of "off" gain transistors 15 in each row. During operations other than recall and match, the access transistors 19 are turned on by applying an appropriate potential to their gates 22. Electrical access to the first storage electrodes 3 of all the memory cells 1' is then provided by means of the subrow lines 4'.

The same technique can be used to improve the match operation, and the same circuit can be used with other memory cells described herein to improve the output signals therefrom.

In content addressable memories, it is particularly useful if a complete word can be rapidly entered in to the memory. In the memory shown in part in FIG. 1, to enter a word in a row of memory cells 1, each bit in the word must be entered in a seperate enter operation. In memories comprised of the memory cells 1" shown in FIG. 5, a complete word can be entered in one row of memory cells 1" using a modified enter operation. To enter a word in a particular row of memory cells 1", the potential $V_r$ is maintained on both the first and second row lines 4, 6 of that row of memory cells 1", and the potential $V_g'$ is applied to the row gate line 24 of that row to form a minority carrier channel beneath the second gate 23 of all the memory cells 1" in that row. Under these conditions, the first storage electrode 3, the second gate 23, and the second storage electrode 5 of each memory cell 1" form an extended gate. In each memory cell 1" in which a one is to be entered, the potential $V_h$ is applied to the match zero electrode 9 and the match one electrode 11 is grounded. In each memory cell 1" in which a zero is to be entered, the potential $V_h$ is applied to the match one electrode 11 and the match zero electrode 9 is grounded. Then most of the holes stored in each of the memory cells 1" accumulate in the inversion region beneath the electrode in that memory cell 1" to which the potential $V_h$ is applied. Then the row gate line 24 is grounded, extinguishing the minority carrier channels beneath the second gate electrodes 23 in that row. The holes stored in the inversion regions beneath the match zero and match one electrodes 9, 11 are then transferred to the first and second storage electrodes 3, 5, respectively, by grounding all the match zero and match one electrodes 9, 11. In this manner a complete word has been entered in a particular row of memory cells 1" without destroying the data stored in any other memory cells 1".

In other respects, the memory cells 1" can be operated in the same manner as the memory cells 1 of FIG. 1.

Figure 6:
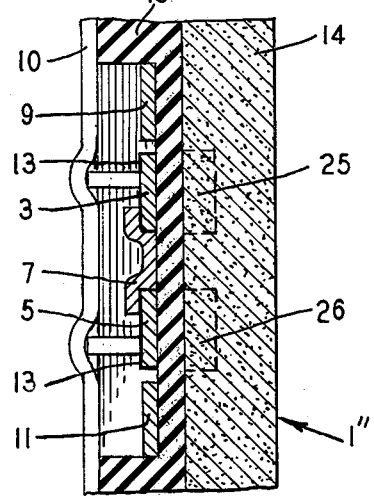
FIG. 6 shows a cross-sectional view of a third variation on the memory cell shown in FIGS. 1 and 2.

The memory cell 1''' shown in FIG. 6 differs from the memory cell 1 of FIG. 1 and 2 in that the semiconducting regions 25, 26 have been formed beneath the first and second storage electrodes 3, 5, respectively, by doping these regions to be of the opposite conductivity type as is the semiconducting material 14. Since it is being assumed herein that the semiconducting material 14 is N-type, the semiconducting regions 25, 26 are P-type. In most respects, the operation of the memory cell 1''' shown in FIG. 6 is similar to the operation of the memory cell 1. However, the holes which are used to represent binary datum in the memory cell 1''' are obtained from the semiconducting regions 25, 26 and therefore in this memory cell 1''' the hole accumulation operation is not required.

The purpose of the semiconducting regions 25, 26 is to improve the output signal from the memory cell 1''' during the recall and match operations. When a potential well containing a large number of holes is interrogated, the change in the potential on the electrode associated with that potential well is proportional to the change in capacitance of that electrode caused by the removal of the stored holes. Unlike the previously described memory cells, in the memory cell 1''' shown in FIG. 6 holes are stored beneath the storage electrodes 3, 5 in accumulation regions. In the interrogation process, when these holes are extracted, a depletion region of considerable extent is formed beneath the storage electrodes 3, 5. Therefore during the interrogation process, the change in capacitance of a storage electrode beneath which a large number of holes is stored in an accumulation region is increased over what it would be if an inversion region were used to store the holes. The output signal when a nominally empty inversion region is interrogated will also be enhanced unless almost all holes are removed therefrom in the enter operation and the potential well is kept depleted of holes by frequent refresh operations.

The disadvantage of the memory cell 1''' shown in FIG. 6 is that rather large potentials are required to deplete the semiconductor regions 25, 26 during the enter and interrogation operations. If semiconducting regions 25, 26 are extended to beneath all or part of the match zero and match one electrodes 9, 11, respectively, smaller potentials can be used in the interrogation process, but larger potentials are then required in the enter process. To minimize the magnitude of the potentials required, the semiconducting regions 25, 26 should be shallow and lightly doped, and can best be formed using ion implantation. The output signals of other memory cells described herein, such as the memory cell 1' of FIG. 3 and the memory cell 1" of FIG. 5, can also be enhanced by forming shallow P-type regions beneath those storage electrodes which are monitored during interrogation.

In FIG. 7 a row of memory cells 1 is shown in which means for entering a complete word in a row of memory cells 1 is provided. The memory shown in part in FIG. 7 can be operated in the same way as the memory shown in part in FIG. 1. However, in the memory shown in FIG. 7, by means of the first shift register formed by the combination of the first transfer electrodes 27 and the match zero electrodes 9, and the second shift register, formed by the combination of the second transfer electrodes 29 and the match one electrodes 11, a word can be entered in one row of memory cells 1. The shift registers can be charge coupled, two phase shift registers which are well known in the prior art. Before entering a new word in a particular row of memory cells 1, the old word stored therein must be removed. In one method of operation, any holes stored beneath the first and second storage electrodes 3, 5 of the memory cells 1' in that particular row are transferred to the match zero and match one electrodes 9, 11, respectively, by applying appropriate potentials to these electrodes. Then by means of the first and second shift registers, these holes are shifted out, say from left to right, and holes, in a pattern representing the new word are shifted in, from left to right. Using the data representation scheme described previously, the hole density pattern representing the new word in the second shift register is just the complement of the hole density pattern in the first shift register. If there are N memory cells 1 per row, then after 2N shifts, the holes representing the new word are stored beneath the appropriate match zero and match one electrodes 9, 11. These holes are then shifted in to the inversion regions beneath the first and second storage electrodes 3, 5 of each memory cell 1 in that particular row. Also by detecting the hole pattern of the old word as it is shifted out, and using that signal to generate the new word, the old word can be refreshed.

Data can also be entered in a column of memory cells 1 by using the method described for the memory shown in FIG. 1.

In FIG. 8 is shown a portion of one row of a memory comprised of a second type of memory cell 31 which can be operated according to the methods of this invention. A cross-sectional view of one memory cell 31 taken along line 9—9 of FIG. 8 is shown in FIG. 9. The memory cell 31 shown in FIG. 8 and 9 is similar to the memory cell 1 shown in FIG. 1 and 2, but in the memory cell 31, the first and second storage electrodes 33, 35 are located at the extremes of the memory cell 31, and the match zero and match one electrodes 39, 41 are located on the inside of the memory cell 31. Also the gate 37 of any particular memory cell 31 is connected in common with the gates 37 of other memory cells 31 in the same row as that particular memory cell 31. The method of representing binary data, and the recall, match, refresh, and data retention operations for the memory cell 31 are substantially the same as for the memory cell 1.

However in memories comprised of the memory cell 31, data can be entered in a complete row of memory cells 31 in one enter operation. Prior to the enter operation, the memory is in the data retention mode in which a potential $V_r$ is maintained on the first and second row lines 34, 36. Then the following procedure can be used to enter data in a particular row of memory cells 31. In each of those memory cells 31 in that row in which a one is to be entered, the potential $V_g$ is applied to the match one electrode 41, and the potential $V_h$ is applied to the match zero electrode 39. In each of those memory cells 31 in that row in which a zero is to be entered, the potential $V_h$ is applied to the match one electrode 41, and the potential $V_g$ is applied to the match zero electrode 39. The holes in each memory cell 31 in that row are transferred to beneath the match one and match zero electrodes 39, 41 of each memory cell 31 by grounding the first and second row lines 34, 36 of that particular row, and then the potential $V_g$ is applied to the third row line 38 to form a minority carrier channel beneath the gate electrodes 37 of all the memory cells 31 in that row. The holes in each of the memory cells 31 accumulate beneath the electrode in that memory cell 31 to which the potential $V_h$ has been applied. Then the third row line 38 of that particular row is grounded, thereby extinguishing the minority carrier channels. Finally the holes in each memory cell 31 are transferred from beneath the match zero and match one electrodes 39, 41 to beneath the first and second storage electrodes 33 35 by applying the potential $V_r$ to the first and second row lines 34, 36 of that row and grounding the match zero and match one electrodes 33, 35. In this manner a complete word has been entered in one row of memory cells 31 without destroying the data stored in the other memory cells 31.

In an alternative method of entering data, the same operations described above are used, except that the potential $V_r$ is maintained on the first and second row lines 34, 36 of that row of memory cells 31 throughout the enter operation. In this method, data can be entered in either part of or all of the memory cells 31 in any row. The match one and match zero electrodes 39, 41 of those memory cells 31 in which data is not to be entered are maintained at ground potential.

Data can also be entered simultaneously in each memory cell 31 in one column of memory cells 31 by applying an appropriate potential to the match zero and match one column lines 40, 42 of that column of memory cells 31, so that together with the gate electrodes 37 of that column, an extended minority carrier channel is formed between the inversion regions beneath the first and second storage electrodes 33, 35 of that column. Then to enter a one in a particular memory cell 31, the potential $V_h$ is applied to the first storage electrode 33 of that memory cell 31, while maintaining the second storage electrode 35 of that memory cell 31 at the potential $V_r$. To enter a zero in a particular memory cell 31, the potential $V_h$ is applied to the second storage electrode 35 of that memory cell 31 while maintaining the first storage electrode 33 of that memory cell 31 at the potential $V_r$. In each memory cell 31, most of the holes accumulate beneath that electrode to which the potential $V_h$ has been applied. Then the minority carrier channel is extinguished by grounding the gates 37 and the match zero and match one column lines 40, 42. Finally the memory cell 31 is returned to the data retention mode by applying the potential $V_r$ to both the first and the second row lines 34, 36. This method of entering data is used in the data refresh operation.

FIG. 10 shows a cross-sectional view of a memory cell 31' which is a modified form of the memory cell 31 shown in FIG. 8. The memory cell 31' can be operated in the same way as the memory cell 31. The modification consists of introducing the semiconducting regions 46, 47 beneath the first and second storage electrodes 33, 35, respectively. The improvements produced by this modification have been explained in the description of the memory cell 1" shown in FIG. 6 and need not be repeated.

FIG. 11 shows a memory cell 31" which is a second modified version of the memory cell 31 shown in FIG. 1 and 2. The memory cell 31" has been formed from the memory cell 31 by eliminating the match one electrode 41 and the match one column line 42. Except for the enter operation and the special match operation to be described, the operation of this memory cell 31" is similar to the operation of the memory cell 1' shown in FIG. 3.

In memories comprised of memory cells 31", data can be entered in a plurality of memory cells 31" in one row in a single enter operation. To enter a word in a plurality of memory cells 31" in a particular row of memory cells 31", the potential $V_g$ is applied to the third row line 38 of that row of memory cells 31", the potential $V_h$ is applied to the first row line 34 of that row of memory cells 31", and the potential $V_r$ is applied to all the column lines 40 of those memory cells 31" in that row in which data is to be entered. The potential $V_r$ is maintained on the second row line 36. Then most of the holes in each of the memory cells 31" in which data is to be entered, accumulate beneath the first storage electrode 33 of each of these memory cells 31". Next the column lines 40 of those memory cells 31" in which a one is to be entered are grounded. Then the potential $V_h$ is applied to the second row line 36 of that row, and the potential $V_r$ is applied to the first row line 34 of that row. As a result most of the holes in those memory cell 31" whose column lines 40 are still at the potential $V_r$ accumulate beneath the second storage electrodes 35 of those memory cells 31". Then all the column lines 40 and the third row line 38 are grounded. Finally the potential $V_r$ is applied to the second row line 36 of that row of memory cells 31" to return the memory to the data retention mode.

In a memory comprised of memory cells 31", the match zero operation can be performed simultaneously on a plurality of memory cells 31" in one row, but with one exception, the match zero operation cannot be performed simultaneously on a plurality of memory cells 31" in one row. As was explained in the description of the operation of the memory cell 1' of FIG. 3 the match one operation can be performed a column at a time. The exception is when a complete row of ones is to be searched for. In this case, the gates 37 can be used to interrogate the second storage electrodes 35 by applying an appropriate potential to the third row lines 38 and monitoring the second row lines 36. This exception can be used to advantage in performing certain administrative functions. For example, it is often necessary to determine which rows in the memory are not being used. By storing ones in all of the memory cells 31" in each of those rows which are not being used, the match one operation described above can be used to determine which, if any, rows are available for the entry and storage of data.

In memories comprised of memory cells 31", data can also be entered in a plurality of memory cells 31" in one column using a single enter operation. In those memory cells 31" in which a one is to be entered, the potential $V_h$ is applied to the first row line 34, and the potential $V_r$ is applied to the second row line 36. In those memory cells 31" in which a zero is to be entered, the potential $V_h$ is applied to the second row line 36 and the potential $V_r$ is maintained on the first row line 34. Then a minority carrier channel is formed beneath all the gate electrodes 37 of those memory cells 31" in which data is to be entered by applying the potential $V_g$ to the third row lines 38 which are connected to those gate electrodes 37. Next a potential is applied to the match zero column line 40 of that column of memory cells 31", to form a minority carrier channel beneath the match zero electrodes 39 of that column of memory cells 31". After the holes in each memory cell 31" in which data is being entered, have redistributed themselves, the third row lines 38 and the match zero column line 40 are grounded, thereby extinguishing the minority carrier channels. To return the memory to the data retention mode, $V_r$ is re-established on all the first and second row lines 34, 36.

Considering the operation of the memory cell 31 of FIG. 8, it is evident that the gate electrode 37 is not used in the match operation, and is required in the recall operation only if a differential output is desired. However, the gate electrode 37 is required to enter data in a plurality of memory cells 31 in one row of memory cells 31 using only one enter operation. Therefore, by eliminating the gate electrode 37 and the third row line 38, and locating the match zero and match one electrodes 39, 41 sufficiently close together so that the potential wells formed thereunder overlap, a memory cell which can be used in memories will full match capabilities, but with only single sided output in the recall operation, and in which data can only be entered in a plurality of memory cells in one column in a single enter operation, can be formed.

FIG. 12 shows one portion of a row of memory cells 31''' from a memory comprised of such memory cells 31'''. These memory cells 31''' are formed from the memory cell 31 of FIG. 8 by eliminating the second storage electrode 35, the second row line 36, the match one electrode 41, and the match one column line 42, and adding the diffused row line 48. The row line 48 is formed in the semiconducting material 44 and is of the opposite conductivity type as the remainder of the semiconducting material 44. A one is represented in the memory cell 31''' by storing a relatively large number of holes beneath the first storage electrode 33 and a zero is represented by storing a relatively small number of holes beneath the first storage electrode 33. To nondestructively recall datum stored in a memory cell 31''', the first storage electrode 33 is interrogated by means of the match zero electrode 39. Holes are entered in to the inversion region beneath the first storage electrode 33 by forming a minority carrier channel between the inversion regions beneath the first storage electrodes 33 and the diffused row line 48 by applying the appropriate potentials to the gate electrode 37 and to the match zero electrode 39, and controlling the potential on the diffused row line so that holes flow in to the inversion region beneath the first storage electrode 33. Holes are extracted from the inversion region beneath the first storage electrode 33 by forming a minority carrier channel between this inversion region and the diffused row line 48, as was described above, and adjusting the potential on the diffused row line 48 so that holes are extracted from the inversion region beneath the first storage electrode 33. Data can be entered in a plurality of memory cells 31''' in either one column of memory cells 31''' or in one row of memory cells 31''' in one enter operation. The match zero operation can be performed on a plurality of memory cells 31''' in one row simultaneously, but the match one operation can be performed on only one column of memory cells 31''' at a time, as has been explained previously. The refresh operation consists of a recall operation followed by a re-enter operation.

The memory cell 31''' can be modified by interchanging the relative positions of the first storage electrode 33 and the match zero electrode 39, and instead of connecting the gate electrodes 37 to a row line 38, connect them to a column line.

While the method of this invention has been particularly described with reference to particular memory cells and the operation of these memory cells have been described with certain assumptions concerning the composition of these memory cells, it will be understood by those skilled in the semiconductor art, that various changes in the form of the memory cells, and in the details of the method of operation of these memory cells may be made without departing from the spirit and scope of this invention. For example, although the invention has been described in conjunction with memory cells in which holes were used as the mobile charge carriers which are used to represent data, this invention can equally well be used with those memory cells in which mobile electrons are used to represent data. Also various peripherial circuits, such as decoders, sense amplifiers, and buffers can be included on the semiconducting chip with the memory cells to give improved performance.

I claim:

1. In the class of semiconductor binary memory cells wherein
   a semiconducting material and a first electrode in proximity to and insulated from said semiconducting material are utilized to form in said semiconducting material a first localized minimum potential energy region for one polarity of the mobile charge carriers in said semiconducting material,
   a second electrode in proximity to and insulated from said semiconducting material is utilized to form in said semiconducting material a second localized minimum potential energy region for said polarity of mobile charge carriers,
   a one is stored in a memory cell by maintaining a relatively large number of said polarity of mobile charge carriers in said first localized minimum potential energy region and maintaining a relatively small number of said polarity of mobile charge carriers in said second localized minimum potential energy region, and a zero is stored in said memory cell by storing a relatively small number of said polarity of mobile charge carriers in said first localized minimum potential energy region and storing a relatively large number of said polarity of mobile charge carriers in said second localized minimum potential energy region, a method of recalling the datum stored in the said memory cell, comprising the steps of forming in said semiconducting material a third localized minimum potential energy region for said polarity of mobile charge carriers such that if a relatively large number of mobile charge carriers of said polarity are in the said first localized minimum potential energy region, some of these said charge carriers transfer to the said third localized minimum potential energy region, altering said third localized minimum potential energy region such that most of any of the said polarity of mobile charge carriers which had previously transferred from said first localized minimum potential energy region, transfer back to said first localized minimum potential energy region, detecting any change in capacitance between said first electrode and the said semiconducting material resulting from said transfers of mobile charge carriers between said first and said third localized minimum potential energy regions, and interpreting a relatively large change in the said capacitance between said first electrode and said semiconducting material as indicating a one was stored in said memory cell, and interpreting the absence of a relatively large change in the said capacitance between said first electrode and said semiconducting material as indicating a zero was stored in said memory cell.

2. The method of claim 1 wherein any change in said capacitance between the said first electrode and the said semiconducting material resulting from said transfer of said polarity of mobile charge carriers from the said first to the said third localized minimum potential energy regions is utilized to determine the datum stored in said memory cell.

3. The method of claim 1 wherein any change in said capacitance between the said first electrode and the said semiconducting material resulting from said transfer of said polarity of mobile charge carriers from the said third to the said first localized minimum potential energy regions is utilized to determine the datum stored in said memory cell.

4. The method of claim 1 wherein a relatively large change in the electrical charge on said first electrode is used to detect a relatively large change in the said capacitance between the said first electrode and the said semiconducting substrate, and the absence of a relatively large change in the electrical charge on said first electrode is used to detect the absence of a relatively large change in the said capacitance between the said first electrode and the said semiconducting substrate.

5. In the class of semiconductor binary memory cells wherein a semiconducting material and a first electrode in proximity to and insulated from said semiconducting material are utilized to form in said semiconducting material a first localized minimum potential energy region for one polarity of the mobile charge carriers in said semiconducting material, a second electrode in proximity to and insulated from said semiconducting material is utilized to form in said semiconducting material a second localized minimum potential energy region for said polarity of mobile charge carriers, a one is stored in a memory cell by maintaining a relatively large number of said polarity of mobile charge carriers in said first localized minimum potential energy region and maintaining a relatively small number of said polarity of mobile charge carriers in said second localized minimum potential energy region, and a zero is stored in said memory cell by storing a relatively small number of said polarity of mobile charge carriers in said first localized minimum potential energy region and storing a relatively large number of said polarity of mobile charge carriers in said second localized minimum potential energy region, a method of recalling the datum stored in the said memory cell, comprising the steps of forming in said semiconducting material a third localized minimum potential energy region for said polarity of mobile charge carriers such that if a relatively large number of mobile charge carriers of said polarity are in the said second localized minimum potential energy region, some of these said charge carriers transfer to the said third localized minimum potential energy region, altering said third localized minimum potential energy region such that most of any of the said polarity of mobile charge carriers which had previously transferred from said second localized minimum potential energy region, transfer back to said second localized minimum potential energy region, detecting any change in capacitance between said second electrode and the said semiconducting material resulting from said transfers of mobile charge carriers between said second and said third localized minimum potential energy regions, and interpreting a relatively large change in the said capacitance between said second electrode and said semiconducting material as indicating a zero was stored in said memory cell, interpreting the absence of a relatively large change in the said capacitance between said second electrode and said semiconducting material as indicating a one was stored in said memory cell.

6. The method of claim 5 wherein any change in said capacitance between the said second electrode and the said semiconducting material resulting from said transfer of said polarity of mobile charge carriers from the said second to the said third localized minimum potential energy regions is utilized to determine the datum stored in said memory cell.

7. The method of claim 5 wherein any change in said capacitance between the said second electrode and the said semiconducting material resulting from said transfer of said polarity of mobile charge carriers from the said third to the said second localized minimum potential energy regions is utilized to determine the datum stored in said memory cell.

8. The method of claim 5 wherein a relatively large change in the electrical charge on said second electrode is used to detect a relatively large change in the said capacitance between the said second electrode and the said semiconducting substrate, and the absence of a relatively large change in the electrical charge on said second electrode is used to detect the absence of a relatively large change in the said capacitance between said second electrode and the said semiconducting substrate.

9. In the class of semiconductor binary memory cells wherein
- a semiconducting material and a first electrode in proximity to and insulated from said semiconducting material are utilized to form in said semiconducting material a first localized minimum potential energy region for one polarity of the mobile charge carriers in said semiconducting material,
- a second electrode in proximity to and insulated from said semiconducting material is utilized to form in said semiconducting material a second localized minimum potential energy region for said polarity of mobile charge carriers,
- a one is represented in a memory cell by maintaining a relatively large number of said polarity of mobile charge carriers in said first localized minimum potential energy region and maintaining a relatively small number of said polarity of mobile charge carriers in said second localized minimum potential energy region, and
- a zero is represented in said memory cell by storing a relatively small number of said polarity of mobile charge carriers in said first localized minimum potential energy region and storing a relatively large number of said polarity of mobile charge carriers in said second localized minimum potential energy region,
- a method of detearmining whether the binary datum stored in the said memory cell is the same as or different from a given binary datum, comprising the steps of
- if the said given datum is a one, forming in said semiconducting material a third localized minimum potential energy region for mobile charge carriers of said polarity such that if a relatively large number of mobile charge carriers of said polarity are in the said second localized minimum potential energy region, some of these said charge carriers transfer to the said third localized minimum potential energy region,
- altering said third localized minimum potential energy region such that most of any of the said polarity of mobile charge carriers which had previously transferred from said second localized minimum potential energy region, transfer back to said second localized minimum potential energy region,
- detecting any change in capacitance between said second electrode and the said semiconducting material resulting from said transfers of mobile charge carriers between said second and said third localized minimum potential energy regions, and
- interpreting a relatively large change in the said capacitance between said second electrode and said semiconducting material as indicating the said datum stored in said memory cell is different from the said given datum,
- interpreting the absence of a relatively large change in the said capacitance between said second electrode and said semiconducting material as indicating the said datum stored in said memory cell is the same as the said given datum,
- if the said given datum is a zero, forming in said semiconducting material a fourth localized minimum potential energy region for mobile charge carriers of said polarity such that if a relatively large number of mobile charge carriers on said polarity are in the said first localized minimum potential energy region, some of these said charge carriers transfer to the said fourth localized minimum potential energy region,
- altering said fourth localized minimum potential energy region such that most of any of the said polarity of mobile charge carriers which had previously transferred from said first localized minimum potential energy region, transfer fack to said first localized minimum potential energy region,
- detecting any change in capacitance between said first electrode and the said semiconducting material resulting from said transfers of mobile charge carriers between said first and said fourth localized minimum potential energy regions, and
- interpreting a relatively large change in the said capacitance between said first electrode and said semiconducting material as indicating the said datum stored in said memory cell is different from the said given datum,
- interpreting the absence of a relatively large change in the said capacitance between said first electrode and said semiconducting material as indicating the said datum stored in said memory cell is the same as the said given datum.

10. The method of calim 9 wherein
- a relatively large change in the electrical charge on said first electrode is used to detect a relatively large change in the said capacitance between the said first electrode and the said semiconducting substrate, and the absence of a relatively large change in the electrical charge on said first electrode is used to detect the absence of a relatively large change in the said capacitance between said first electrode and the said semiconducting substrate, and
- a relatively large change in the electrical charge on said second electrode is used to detect a relatively large change in the said capacitance between the said second electrode and the said semiconducting substrate, and the absence of a relatively large change in the electrical charge on said second electrode is used to detect the absence of a relatively large change in the said capacitance between said second electrode and the said semiconducting substrate.

11. In the class of semiconductor random access memories wherein
- a plurality of first electrodes and a semiconducting substrare are utilized to form a plurality of memory cells,
- in each of said memory cells one of said first electrodes is utilized to form in said semiconducting substrate a first localized minimum potential energy region for one polarity of mobile charge carriers in said semiconducting substrate,
- in each of said memory cells a one is represented by storing a relatively large number of mobile charge carriers of said polarity in the said first localized minimum potential energy region of that said memory cell,
- in each of said memory cells a zero is represented by storing a relatively small number of mobile charge carriers of said polarity in the said first localized minimum potential energy region of that said memory cell, the said memory cells are interconnected such that the said first electrode of each of the said memory cells is connected in common with the said first electrode on some of the other of the said memory cells, a method of entering datum in any particular one of the said memory cells, comprising the steps of to enter a one in said particular memory cell, applying a first potential between the said first electrode of the said particular memory cell and the said semiconducting substrate, to enter a zero is said particular memory cell, applying a second potential between the said first electrode of the said particular memory cell and the said semiconducting substrate, both said first potential and said second potential being a magnitude and polarity such that when either of these said potentials are applied between the said first electrode of one of the said memory cells and the said semiconducting substrate, a localized minimum potential energy region for said polarity of mobile charge carriers is formed in said semiconducting substrate, and the localized minimum potential energy region so formed by so applying either said first potential or said second potential can be used to store the said relatively large number of mobile charge carriers of said polarity used to represent a one in one of said memory cells.

12. In the class of semiconductor random access binary memory cells wherein
a semiconducting substrate and a first electrode in proximity to and insulated from said semiconducting substrate are utilized to form in said semiconducting substrate a first localized minimum potential energy region for one polarity of mobile charge carriers in said semiconducting substrate, a one is represented in a memory cell by storing a relatively large number of said polarity of mobile charge carriers in said first localized minimum potential energy region, a zero is represented in said memory cell by storing a relatively small number of said polarity of mobile charge carriers in said first localized minimum potential energy region, a method of entering datum in said memory cell, comprising the steps of applying a first potential to said first electrode when entering a one in said memory cell, applying a second potential to said first electrode when entering a zero in said memory cell, both said first potential and said second potential being of a magnitude and polarity such that when either of these said potentials are applied between the said first electrode and the said semiconducting substrate, a localized minimum potential energy region for said polarity of mobile charge carriers is formed in said semiconducting substrate.

13. The method of claim 2 wherein
a channel for mobile charge carriers of said polarity is formed in said semiconducting substrate, said channel overlapping the localized minimum potential energy regions formed in said semiconducting substrate when either said first or said second potential is applied to said first electrode.

14. In the class of semiconductor random access binary memory cells wherein,
a first electrode and a semiconductor substrate are utilized to form in said semiconductor substrate a first localized minimum potential energy region for one polarity of mobile charge carriers in said semiconductor substrate, a one is represented in said memory cell by maintaining a relatively large number of said polarity of mobile charge carriers in said first localized minimum potential energy region, a zero is represented in said memory cell by maintaining a relatively small number of said polarity of mobile charge carriers in said first localized minimum potential energy region, a method of operating said memory cell, comprising the steps of entering a one is said memory cell by applying a first potential between said first electrode and said semiconductor substrate, entering a zero in said memory cell by applying a second potential between said first electrode and said semiconductor substrate, both said first potential and said second potential being of a magnitude and polarity such that when either of these said potentials are applied between the said first electrode and the said semiconductor substrate, a localized minimum potential energy region for said polarity of mobile charge carriers is formed in said semiconductor substrate, recalling the datum stored in said memory cell by operating on the mobile charge carriers of said polarity which are stored in the said first localized minimum potential energy region such that if the binary datum stored in said memory cell has one of it's two possible values, a relatively large change in the capacitance between said first electrode and said semiconductor material is induced, and if the binary datum stored in said memory cell has the other of it's possible values, a relatively small change in the capacitance between said first electrode and the said semiconductor substrate is induced.

* * * * *